(12) United States Patent
Mao et al.

(10) Patent No.: US 9,177,982 B2
(45) Date of Patent: Nov. 3, 2015

(54) LATERAL LIGHT SHIELD IN BACKSIDE ILLUMINATED IMAGING SENSORS

(71) Applicant: OMNIVISION TECHNOLOGIES, INC., Santa Clara, CA (US)

(72) Inventors: Duli Mao, Sunnyvale, CA (US); Dyson H. Tai, San Jose, CA (US); Vincent Venezia, Los Gatos, CA (US); Yin Qian, Milpitas, CA (US); Gang Chen, San Jose, CA (US); Howard E. Rhodes, Nokomis, FL (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/319,807

(22) Filed: Jun. 30, 2014

(65) Prior Publication Data

US 2014/0312447 A1    Oct. 23, 2014

Related U.S. Application Data

(62) Division of application No. 13/370,085, filed on Feb. 9, 2012, now Pat. No. 8,772,898.

(51) Int. Cl.
*H01L 27/146* (2006.01)

(52) U.S. Cl.
CPC ........ *H01L 27/1462* (2013.01); *H01L 27/1464* (2013.01); *H01L 27/14623* (2013.01); *H01L 27/14685* (2013.01)

(58) Field of Classification Search
CPC .................. H01L 27/14603; H01L 27/14623; H01L 27/14627; H01L 27/14636; H01L 27/14618
USPC ......................................... 257/447, 432, 460
See application file for complete search history.

(56) References Cited

U.S. PATENT DOCUMENTS

| 6,559,433 | B1 | 5/2003 | Ozawa |
| 7,122,840 | B2 | 10/2006 | Hsu et al. |
| 7,952,096 | B2 | 5/2011 | Rhodes |
| 8,278,690 | B2 | 10/2012 | Mao et al. |
| 2005/0184353 | A1 | 8/2005 | Mouli |
| 2006/0186547 | A1 | 8/2006 | Wang et al. |
| 2010/0327164 | A1* | 12/2010 | Costello et al. ............ 250/338.1 |
| 2011/0089517 | A1* | 4/2011 | Venezia et al. ................ 257/447 |
| 2013/0200396 | A1 | 8/2013 | Zheng et al. |
| 2013/0207212 | A1 | 8/2013 | Mao et al. |

OTHER PUBLICATIONS

TW Patent Application No. 102104465—Taiwanese Office Action and Search Report, with English Translation, issued Dec. 23, 2014 (14 pages).
CN Patent Application No. 201310049121.0—Chinese Office Action and Search Report, issued Feb. 15, 2015, with English Translation (18 pages).

* cited by examiner

*Primary Examiner* — Kenneth Parker
*Assistant Examiner* — Bo Fan
(74) *Attorney, Agent, or Firm* — Blakely Sokoloff Taylor & Zafman LLP

(57) ABSTRACT

A backside illuminated image sensor includes a semiconductor layer and a trench disposed in the semiconductor layer. The semiconductor layer has a frontside surface and a backside surface. The semiconductor layer includes a light sensing element of a pixel array disposed in a sensor array region of the semiconductor layer. The pixel array is positioned to receive external incoming light through the backside surface of the semiconductor layer. The semiconductor layer also includes a light emitting element disposed in a periphery circuit region of the semiconductor layer external to the sensor array region. The trench is disposed in the semiconductor layer between the light sensing element and the light emitting element.

10 Claims, 5 Drawing Sheets

LATERAL LIGHT SHIELD IN BACKSIDE ILLUMINATED IMAGING SENSORS

CROSS-REFERENCE TO RELATED APPLICATIONS

The present application is a Divisional of U.S. patent application Ser. No. 13/370,085, filed on Feb. 9, 2012, entitled "LATERAL LIGHT SHIELD IN BACKSIDE ILLUMINATED IMAGING SENSORS." U.S. patent application Ser. No. 13/370,085 is hereby incorporated herein by reference.

TECHNICAL FIELD

This disclosure relates generally to imaging sensors, and in particular but not exclusively, relates to backside illuminated ("BSI") complementary metal-oxide-semiconductor ("CMOS") imaging sensors.

BACKGROUND INFORMATION

Many semiconductor imaging sensors today are front side illuminated. That is, these sensors include imaging arrays that are fabricated on the front side of a semiconductor wafer, where incoming light is received at the imaging array from the same front side. Front side illuminated imaging sensors have several drawbacks, for example, a limited fill factor.

BSI imaging sensors are an alternative to front side illuminated imaging sensors. BSI imaging sensors include imaging arrays that are fabricated on the front surface of the semiconductor wafer, but receive incoming light through a back surface of the wafer. BSI imaging sensors may be formed by binding a device wafer to a carrier wafer, followed by thinning down the device wafer. To permit detection of external incoming light from the backside, the device wafer is made extremely thin. For example, the final device wafer thickness in some BSI imaging sensors is only several microns.

Light that is not external incoming light may be emitted within the silicon substrate of the device wafer by peripheral circuit elements. This internally generated light may be optically channeled and travel laterally within the silicon substrate of the device wafer to reach imaging arrays. Such lateral light propagation may produce undesirable signals and interfere with the normal operation of BSI imaging sensors. The relative thinness of the silicon substrate may contribute to lateral light propagation.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for fabricating a BSI imaging sensor that includes a lateral light shield are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
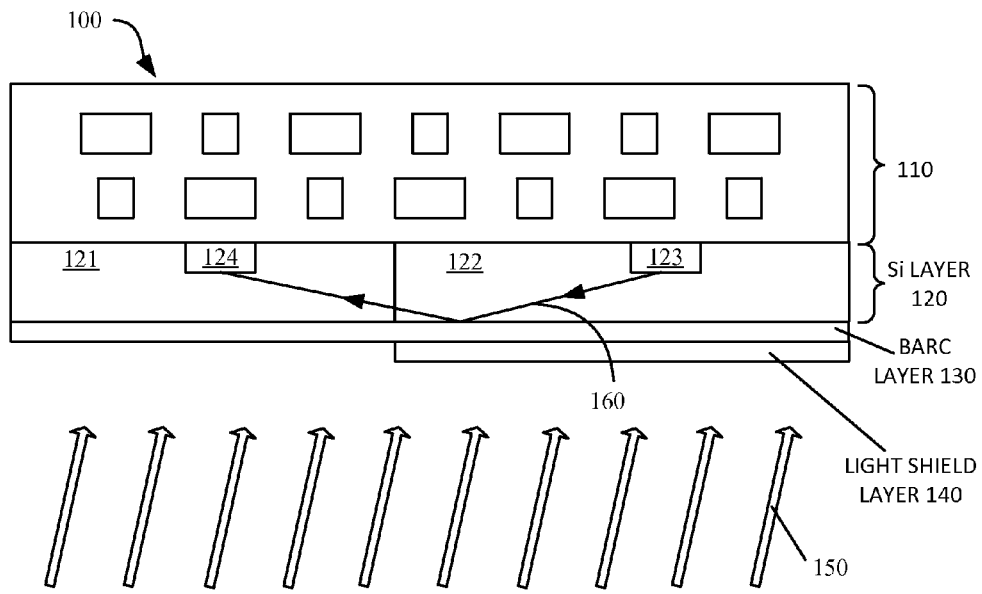
FIG. 1 is a cross-sectional view of a BSI imaging sensor illustrating light propagating laterally in a semiconductor layer.

FIG. 1 is a cross-sectional view of a BSI imaging sensor 100 illustrating light propagating laterally in a semiconductor or silicon ("Si") layer 120. BSI imaging sensor 100 includes a metal stack 110 (alternatively known as a metal-dielectric stack because it contains metal structures inside a dielectric substrate), Si layer 120, a backside anti-reflection coating ("BARC") layer 130, and a light shield layer 140. Si layer 120 includes a sensor array region 121 containing a number of light sensing element 124 that sense light and a periphery circuit region 122 containing light emitting element 123. To permit light sensing element 124 to detect incoming light 150 from the backside as shown in FIG. 1, Si layer 120 is made to be relatively thin, for example, several microns (10 μm or less). As shown in FIG. 1, BARC layer 130 is deposited on the relatively thin Si layer 120. BARC layer 130 reduces reflection of incoming light 150, thereby providing a relatively high coupling of incoming light 150 into sensor array region 121.

In some examples of BSI imaging sensors (not shown in FIG. 1), the term BARC layer is also used to include an additional buffer layer between BARC layer 130 and Si layer 120. The buffer layer provides buffer between BARC layer 130 and Si layer 120. It may include materials such as silicon oxide or silicon nitride. This multi-layer structure may also be collectively known as a dielectric layer. In the present disclosure, the term BARC layer is chosen as an equivalent to dielectric layer.

Also shown in FIG. 1 is light shield layer 140, which may cover several areas of Si layer 120 from incoming light 150. First, it covers black level reference pixels (not shown in FIG. 1) disposed in Si layer 120. Black level reference pixels are sensor pixels that do not receive incoming light 150, and provide black level reference for the BSI imaging sensor 100. Black level reference pixels may be disposed in periphery circuit region 122. Second, light shield layer 140 may cover periphery circuit region 122. By covering periphery circuit region 122, light shield layer 140 reduces or prevents incoming light 150 from interfering with periphery circuit operations.

Certain elements, such as light emitting element 123 within periphery circuit region 122, may emit light. Light emitting element 123 may emit light by various mechanisms, for example, through electroluminescence of biased p-n junctions, and produce light having wavelength in the infrared ("IR") or near-IR ("NIR") spectrum. For example, light emitting element 123 may be a metal-oxide-semiconductor ("MOS") tunnel diode, emitting light that includes a wavelength near 1.1 μm. In one embodiment, light emitting element 123 may be a forward biased diode with ion implant induced dislocations, emitting light that includes a wavelength near 1.5 μm.

The light emitted by light emitting element 123 may travel laterally through Si layer 120 and reach light sensing element 124, thereby producing undesirable signals. Several factors are thought to contribute to this phenomenon.

First, IR and NIR light have wavelengths that are close to Si band gap, thus permitting the light to travel relatively long distances in medium such as Si, $SiO_2$ and $SiN_x$ (silicon nitride). Light path 160 may be representative of IR or NIR light traveling from light emitting element 123 to light sensing element 124. IR and NIR light may propagate up to several hundred micrometers in the abovementioned medium.

Second, light may propagate within Si layer 120 with relatively little loss of energy due to the phenomenon of total internal reflection ("TIR"). BARC layer 130 includes materials such as $SiO_2$ and $SiN_x$. The refractive index of Si is relatively high, (e.g. 3.54) as compared with the refractive index of $SiO_2$ and $SiN_x$, (e.g., 1.5 and 2, respectively). Therefore, if BARC layer 130 includes $SiO_2$, then the critical angle θ for TIR within Si layer 120 may be arcsin(1.5/3.54)=25.1°. If BARC layer 130 includes $SiN_x$, then the critical angle θ for TIR within Si layer 120 may be arcsin(2/3.54)=34.4°.

Third, light shield layer 140 may be composed of metal, which is relatively efficient at reflecting light, thereby confining light (emitted by light emitting element 123) within Si layer 120.

Fourth, as the abovementioned light propagates through Si layer 120, it may generate charge carriers, which may diffuse into sensor array region 121.

In sum, one or several factors such as the ones mentioned above, as well as their combinations, may cause IR and NIR light emitted by light emitting element 123 to propagate along light path 160 and reach sensor array region 121. Therefore, if light emitting element 123 is relatively close to sensor array region 121, it may produce undesirable signals and interfere with the performance of BSI imaging sensor 100.

Embodiments of lateral light shield structures positioned in Si layer 120 to impede a light path between light emitting element 123 and light sensing element 124 are disclosed herein.

Figure 2:
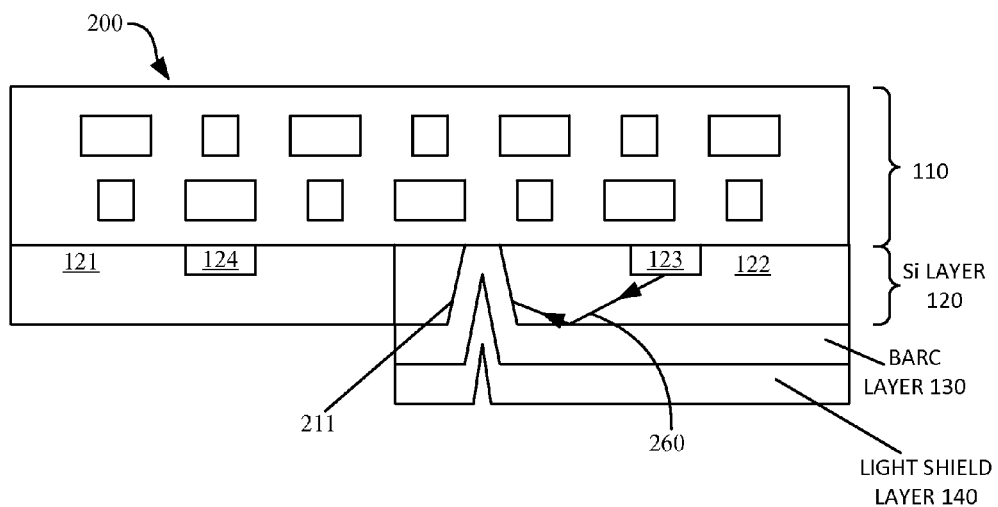
FIG. 2 is a cross-sectional view of a BSI imaging sensor illustrating a lateral light shield including a trench, in accordance with an embodiment of the disclosure.

FIG. 2 is a cross-sectional view of a BSI imaging sensor 200 illustrating a lateral light shield including a trench 211, in accordance with an embodiment of the disclosure. BSI imaging sensor 200 includes metal stack 110, Si layer 120, BARC layer 130, and light shield layer 140. Si layer 120 includes sensor array region 121 containing a number of light sensing element 124 that sense light and periphery circuit region 122 containing light emitting element 123. Si layer 120 may include a substrate layer and an epitaxial layer. Periphery circuit region 122 may surround or substantially surround sensor array region 121 when viewed from the top of BSI imaging sensor 200. Or, periphery circuit region 122 may flank sensor array region 121 on three sides. Periphery circuit region 122 contains circuit elements that facilitate the acquisition of an image charge from light sensing element 124. Light emitting element 123 may be one of the circuit elements that facilitate the acquisition of an image charge from light sensing element 124.

Trench 211 may be positioned such that it substantially impedes a light path between light emitting element 123 and light sensing element 124. In the illustrated embodiment, trench 211 is disposed in Si layer 120, and substantially penetrates through Si layer 120. In one embodiment, trench 211 does not penetrate all the way through Si layer 120. Trench 211 may be located in periphery circuit region 122 (as shown in FIG. 2) or located in sensor array region 121 or in a region containing black level reference pixel (not shown).

In the illustrated embodiment, BARC layer 130 is disposed in trench 211 (following the contours of trench 211) and on sidewalls of trench 211. Since BARC layer 130 follows the contours of trench 211 (forming an inverted "V" shape in the illustrated embodiment), trench 211 may not be completely filled by BARC layer 130. In one embodiment, BARC layer 130 does completely fill trench 211. In the illustrated embodiment, light shield layer 140 is disposed in trench 211 (but not contacting Si layer 120), filling in trench 211 where BARC layer 130 did not completely fill trench 211. In the illustrated embodiment, BARC layer 130 is an inverted "V" shape disposed in Si layer 120 and light shield layer 140 is an inverted "V" shape disposed in the inverted "V" shape of BARC layer 130. In the illustrated embodiment, trench 211 in Si layer 120 is substantially the shape of an isosceles trapezoid, however, trench 211 may be other shapes. The combination of trench 211, BARC layer 130, and light shield layer 140 may be referred to as a lateral light shield because it substantially blocks light in light path 260 emitted by light emitting element 123.

Examples of methods to fabricate BSI imaging sensor 200 are disclosed herein. In one embodiment, trench 211 is first formed in Si layer 120, followed by depositing BARC layer 130 and light shield layer 140. In one embodiment, trench 211 is formed in Si layer 120 after the deposition of BARC layer 130 and light shield layer 140. Yet in another embodiment, after forming trench 211 following the deposition of BARC layer 130 and light shield layer 140, trench 211 may be filled with a substance that enhances its function of blocking a light path between light emitting element 123 and light sensing element 124. An example of the substance used to fill trench 211 may be an optically opaque material (e.g. metal).

Figure 3A:
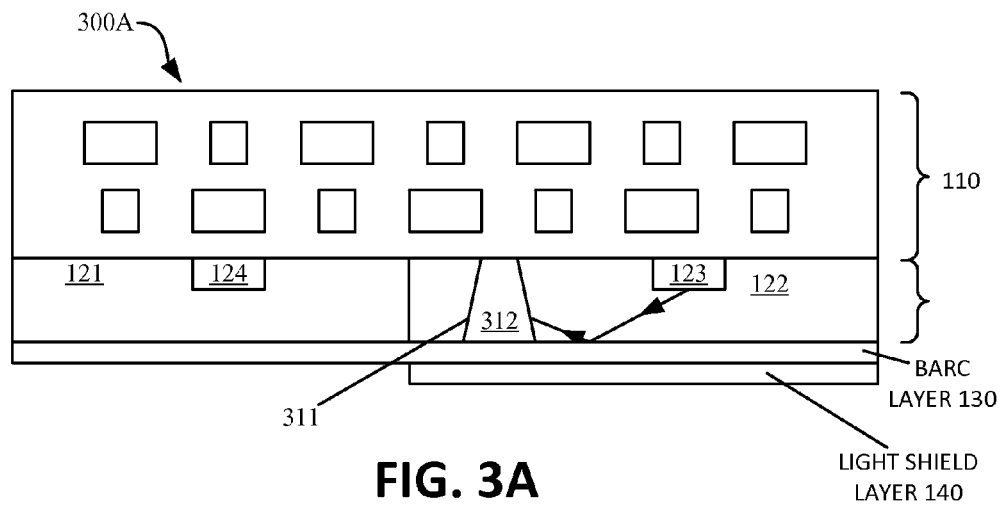
FIGS. 3A and 3B are cross-sectional views of a BSI imaging sensor illustrating a lateral light shield including a filled trench, in accordance with an embodiment of the disclosure.
Figure 3B:
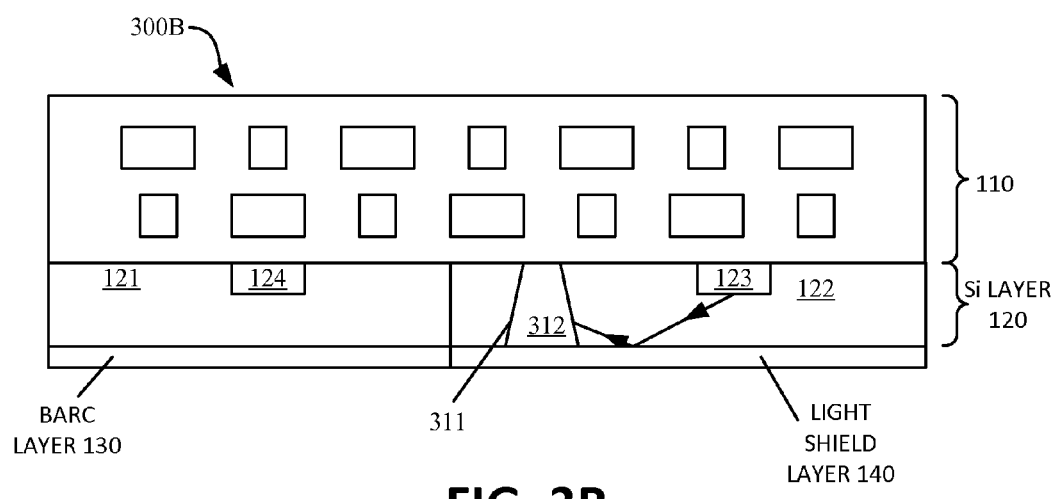

FIGS. 3A and 3B are cross-sectional views of a BSI imaging sensor illustrating a lateral light shield including a filled trench, in accordance with an embodiment of the disclosure. BSI imaging sensor 300A and 300B include metal stack 110, Si layer 120, BARC layer 130 and light shield layer 140. Si layer 120 includes sensor array region 121 containing a number of light sensing element 124 that sense light and periphery circuit region 122 containing light emitting element 123.

Trench 311 is disposed in Si layer 120 of BSI imaging sensors 300A and 300B. Trench 311 may penetrate through Si layer 120. Trench 311 may be positioned such that it substantially impedes light path between light emitting element 123 and light sensing element 124. Trench 311 may also be located in sensor array region 121 or in a region of Si layer 120 containing black level reference pixels (not shown). Trench 311 contains a filler element 312. Filler element 312 may fill trench 311 from a backside surface of Si layer 120 to a frontside surface of Si layer 120. Filler element 312 may be an optically transparent material such as a transparent dielectric. In one embodiment, filler element 312 is an oxide. In one embodiment, filler element 312 is optically opaque. The combination of trench 311 and filler element 312 may be referred to as a lateral light shield because it may impede a light path between light emitting element 123 and light sensing element 124.

In FIG. 3A, BARC layer 130 is illustrated as disposed below both sensor array region 121 and periphery circuit region 122. Light shield layer 140 is illustrated in FIG. 3A as disposed below periphery circuit region 122 and disposed below BARC layer 130. In FIG. 3B, BARC layer 130 is illustrated as disposed below sensor array region 121, but not disposed below periphery circuit region 122. Light shield layer 140 is illustrated in FIG. 3B as disposed below periphery circuit region 122, but not below sensor array region 121. In the illustrated embodiment (FIG. 3B), light shield layer 140 contacts filler element 312 and Si layer 120. Light shield layer 140 may reflect light emitted by light emitting element 123. The light reflected by light shield layer 140 may travel toward the lateral light shield and be reflected by the lateral light shield, thereby shielding sensor array region 121 from light emitted by light emitting element 123.

Figure 4:
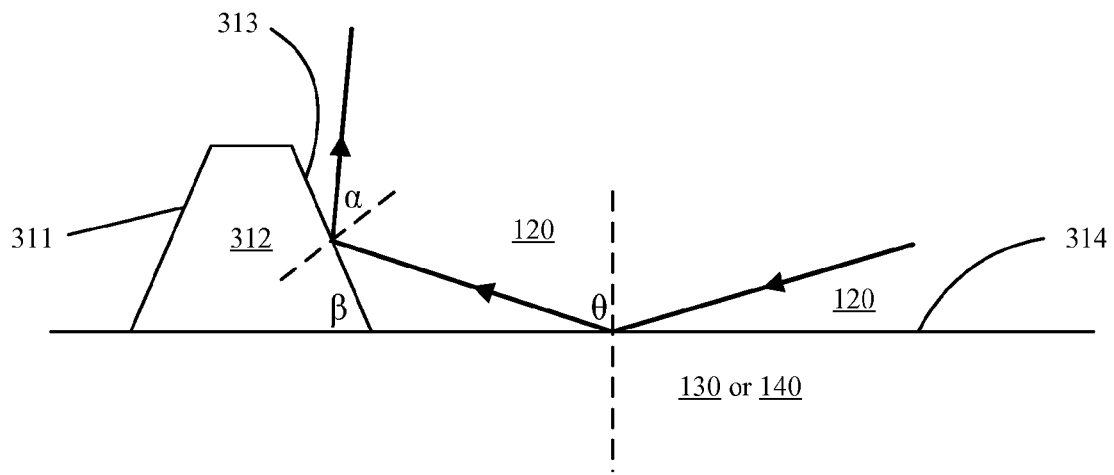
FIG. 4 is a diagram illustrating a light path interacting with structures of a BSI imaging sensor, in accordance with an embodiment of the disclosure.

FIG. 4 is a diagram illustrating a light path interacting with structures of BSI imaging sensor 300A or 300B, in accordance with an embodiment of the disclosure. Trench interface 313 is where filler element 312 contacts Si layer 120 on the edge of trench 311. When filler element 312 is an optically transparent material, trench 311 may be sloped in such a way that light emitted by light emitting element 123 achieves TIR at trench interface 313. Trench 311 may require highly sloped sidewalls so that TIR occurs at trench interface 313. FIG. 4 illustrates how the slope of trench interface 313 affects TIR at trench interface 313. Light reflects off an interface 314 between Si layer 120 and BARC layer 130 (in FIG. 3A) or light shield layer 140 (in FIG. 3B) at angle θ, and strikes trench interface 313 at angle α. Trench slope angle β may be determined as β=180°−(θ+α). If Si layer 120 comprises a first material with a refractive index of 3.54, BARC layer 130 comprises a second material with a refractive index of 3.26, and filler element 312 comprises a third material with a refractive index of 2.89, then, at interface 314, a critical angle θ will be arcsin(3.26/3.54)=67.1°. At trench interface 313, a critical angle α will be arcsin(2.89/3.54)=54.7°. Therefore, trench slope angle β may be 180°−(67.1°+54.7°)=58.2°. Trench 311 may be formed during front side processing or backside processing. The sidewall slope of trench 311 may be either positive or negative. Although FIG. 4 illustrates structures of BSI imaging sensor 300A or 300B, the principles disclosed above may be applied to BSI imaging sensor 200.

Examples of methods to fabricate BSI imaging sensors 300A or 300B are disclosed herein. Trench 311 is formed in Si layer 120 and filled with filler element 312. Trench 311 may be filled with filler element 312 that enhances its function of blocking a light path between light emitting element 123 and light sensing element 124. In one embodiment (as illustrated in FIG. 3A), BARC layer 130 is deposited onto Si layer 120, followed by deposition of light shield layer 140 onto BARC layer 130, below periphery circuit region 122. In one embodiment (as illustrated in FIG. 3B), BARC layer 130 may be deposited only onto the portion of Si layer 120 that contains sensor array region 121 and light shield layer 140 is deposited only onto the portion of Si layer 120 that contains periphery circuit region 122.

Figure 5:
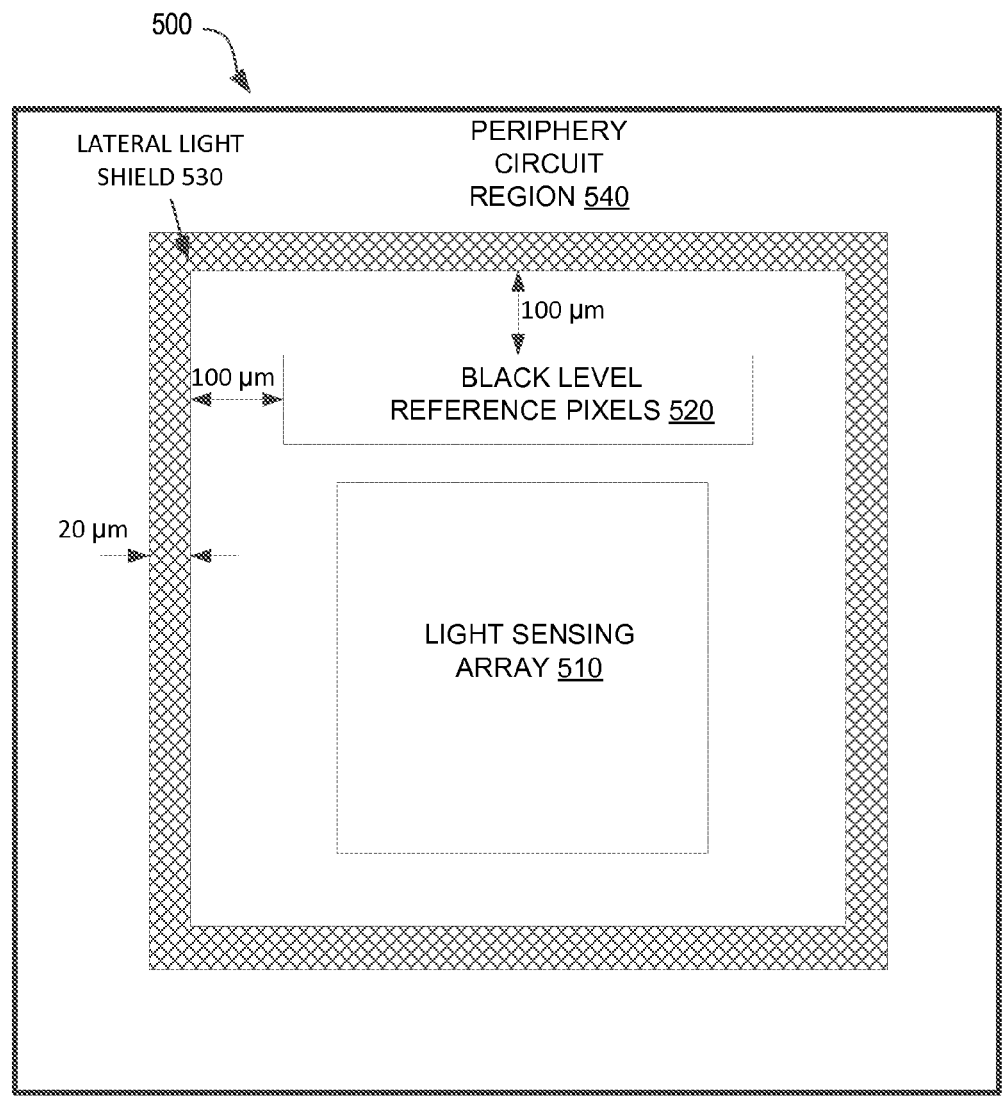
FIG. 5 is a top view of a BSI imaging sensor illustrating a lateral light shield, in accordance with an embodiment of the disclosure.

FIG. 5 is a top view of a BSI imaging sensor illustrating a lateral light shield, in accordance with an embodiment of the disclosure. The BSI imaging sensor is contained in a chip 500. Chip 500 includes a light sensing array 510, black level reference pixels 520, a lateral light shield 530, and a periphery circuit region 540. An example of lateral light shield 530 is found in FIG. 2, where BARC layer 130 is disposed in trench 211. Another example of lateral light shield 530 is found in FIGS. 3A and 3B, where filler element 312 is disposed in trench 311. In the illustrated embodiment, lateral light shield 530 substantially encloses light sensing array 510 and black level reference pixels 520, thus laterally separating light sensing elements (e.g. light sensing element 124) from light emitting elements (e.g. light emitting element 123). Lateral light shield 530 may form an enclosure in a rectangular shape, as shown in FIG. 5. Other examples include other geometric shape enclosures (not shown), such as triangle, trapezoid, polygon, circle, oval, etc. Lateral light shield 530 may only partially enclose (e.g. be disposed on three sides of) light sensing array 510. In FIG. 5, lateral light shield 530 has a width of about 20 μm when viewed from the top. Other widths are possible, but not shown in FIG. 5. Also in FIG. 5, lateral light shield 530 is positioned about 100 μm from light sensing array 510 and black level reference pixels 520, as viewed from the top. Other distances are possible, but not shown in FIG. 5.

Figure 6:
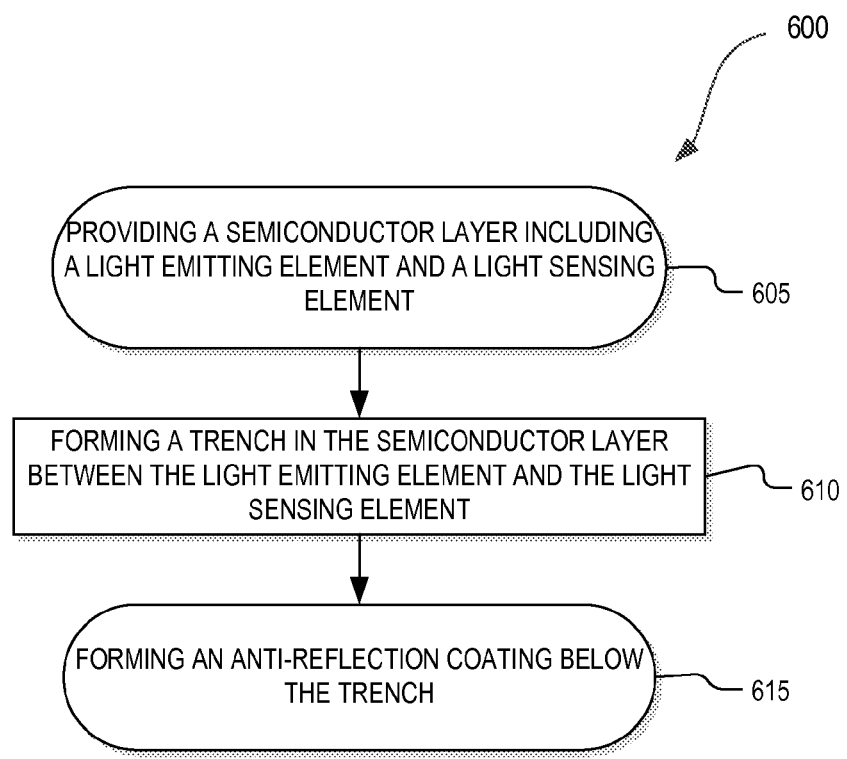
FIG. 6 is a flow chart illustrating a method for fabricating a BSI imaging sensor, in accordance with an embodiment of the disclosure.

FIG. 6 is a flow chart illustrating a method for fabricating a BSI imaging sensor, in accordance with an embodiment of the disclosure. The order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

Process 600 is one example of how to fabricate a BSI imaging sensor. In process block 605, a semiconductor layer having a front surface and a backside surface is provided. The semiconductor layer (e.g. Si layer 120) includes a light sensing element and a periphery circuit region containing a light emitting element and not containing the light sensing element. The periphery circuit region may substantially surround a sensor array region of the semiconductor layer. The periphery circuit region may not contain any light sensing elements because light shield layer (e.g. light shield layer 140) may prevent a light sensing element from receiving light. In process block 610, a trench that penetrates the backside surface of the semiconductor layer is formed. The trench is positioned to prevent light emitted by the light emitting element from reaching the light sensing element. The trench may be formed by known etching processes, for example, wet etching, dry etching, plasma etching, etc. In process block 615, an anti-reflection coating (e.g. BARC 130) is formed below the trench. A light shield layer (e.g. light shield layer 140) may be formed below or adjacent to the anti-reflection coating.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating a backside illuminated image sensor, the method comprising:
   providing a semiconductor layer of the backside illuminated image sensor having a frontside surface and a backside surface, the semiconductor layer including a light sensing element and a periphery circuit region of the semiconductor layer containing a light emitting element and not containing the light sensing element, wherein the periphery circuit region is external to a sensor array region of the semiconductor layer;
   forming a trench that penetrates the backside surface of the semiconductor layer, the trench positioned to prevent light emitted by the light emitting element from reaching the light sensing element; and
   forming an anti-reflection coating along sidewalls of the trench and along a bottom of the trench, but not completely filling the trench with the anti-reflection coating.

2. The method of claim 1, wherein a first refractive index of the anti-reflection coating is less than a second refractive index of the semiconductor layer which facilitates total internal reflection for the light in a light path between the light emitting element and the light sensing element.

3. The method of claim 1 further comprising:
   forming a light shield layer onto the anti-reflection coating below the periphery circuit region of the semiconductor layer.

4. The method of claim 1, wherein the trench is disposed in the periphery circuit region of the semiconductor layer.

5. The method of claim 1, wherein the trench penetrates through the semiconductor layer.

6. A backside illuminated image sensor comprising:
   a semiconductor layer having a frontside surface and a backside surface, the semiconductor layer including:
      a light sensing element of a pixel array disposed in a sensor array region of the semiconductor layer, wherein the pixel array is positioned to receive external incoming light through the backside surface of the semiconductor layer; and
      a light emitting element disposed in a periphery circuit region of the semiconductor layer external to the sensor array region, wherein the periphery circuit region includes circuit elements that facilitate operation of the light sensing element;
   a trench disposed in the semiconductor layer between the light sensing element and the light emitting element; and
   an anti-reflection coating along sidewalls of the trench and along a bottom of the trench, but not completely filling the trench.

7. The backside illuminated image sensor of claim 6 further comprising:
   a light shield layer disposed below the periphery circuit region, wherein the light shield layer is reflective and reflects light in the light path.

8. The backside illuminated image sensor of claim 6 further comprising:
   a light shield layer disposed on the anti-reflection coating below the periphery circuit region of the semiconductor layer.

9. The backside illuminated image sensor of claim 6, wherein the trench is disposed in the periphery circuit region of the semiconductor layer.

10. The backside illuminated image sensor of claim 6, wherein the trench penetrates through the semiconductor layer.

* * * * *